United States Patent [19]
Alcoe et al.

[11] Patent Number: 5,804,984
[45] Date of Patent: Sep. 8, 1998

[54] ELECTRONIC COMPONENT TEST APPARATUS WITH ROTATIONAL PROBE

[75] Inventors: David James Alcoe, Vestal; David Vincent Caletka, Apalachin, both of N.Y.

[73] Assignee: International Business Machines Corporation, Armonk, N.Y.

[21] Appl. No.: 691,732

[22] Filed: Aug. 2, 1996

[51] Int. Cl.⁶ .................................................. G01R 31/02
[52] U.S. Cl. .......................................... 324/761; 324/754
[58] Field of Search ................................. 324/72.5, 754, 324/761, 762, 765; 434/482; 438/14, 18; 257/40, 48

[56] References Cited

U.S. PATENT DOCUMENTS

| | | |
|---|---|---|
| 4,105,970 | 8/1978 | Katz . |
| 4,307,928 | 12/1981 | Petlock, Jr. ............................ 324/754 |
| 4,340,858 | 7/1982 | Malloy .................................. 324/761 |
| 4,622,514 | 11/1986 | Lewis ..................................... 324/761 |
| 4,686,464 | 8/1987 | Elsasser et al. . |
| 4,700,132 | 10/1987 | Yarbrough et al. ..................... 324/761 |
| 4,851,765 | 7/1989 | Driller et al. . |
| 4,885,533 | 12/1989 | Coe . |
| 4,937,707 | 6/1990 | McBride . |
| 5,032,787 | 7/1991 | Johnston et al. . |
| 5,057,969 | 10/1991 | Ameen et al. . |
| 5,159,535 | 10/1992 | Desai et al. . |
| 5,204,615 | 4/1993 | Richards et al. . |
| 5,391,995 | 2/1995 | Johnston et al. . |
| 5,435,732 | 7/1995 | Angulas et al. . |
| 5,519,936 | 5/1996 | Andros et al. . |
| 5,557,213 | 9/1996 | Reuter et al. ............................ 324/754 |

OTHER PUBLICATIONS

IBM Technical Disclosure Bulletin vol. 25, No. 11B, Apr. 1983, .Spring–Loaded Probe With Rotational Wiping Feature., by Ferris et al.

IBM Technical Disclosure Bulletin vol. 37, No. 02B, Feb. 1994, .Tini–Probe Interposer Connector., by Byrnes et al.

*Primary Examiner*—Vinh P. Nguyen
*Attorney, Agent, or Firm*—Lawrence R. Fraley

[57] ABSTRACT

A test apparatus including at least one probe member precisely aligned using two spaced apart means (e.g., thin dielectric layers having copper thereon) such that the probe can effectively engage a conductor (e.g., solder ball) on an electronic module (e.g., ball grid array package). A compressible member (e.g., elastomeric body) is used to bias the probe toward the conductor. Various probe cross-sectional configurations are also provided.

32 Claims, 10 Drawing Sheets

ELECTRONIC COMPONENT TEST APPARATUS WITH ROTATIONAL PROBE

TECHNICAL FIELD

The invention relates to test apparatus for testing electronic components such as those used in information handling systems (computers) or the like. More particularly, the invention relates to such apparatus for testing high density electronic packaging structures, and even more particularly to those which utilize pluralities of extremely small conductive elements such as solder ball arrays as part thereof.

BACKGROUND OF THE INVENTION

Understandably, miniaturization is a main objective of all electronic packaging developers and manufacturers. Accordingly, various electronic packages have been introduced within the past few (e.g., ten) years which accomplish this objective, examples being defined and illustrated in detail in the following U.S. Pat. Nos.:

4,937,707—McBride et al
5,057,969—Ameen et al
5,159,535—Desai et al
5,435,732—Angulas et al
5,519,936—Andros et al These patents are assigned to the same assignee as the present invention and are incorporated herein by reference.

Typically, such packages utilize extremely small conductive members such as spherically-shaped solder balls as the connecting medium. Such solder balls may possess a diameter of only about 0.025 inch to about 0.035 inch, and in the final product for incorporation within a larger electronic structure (e.g., a microprocessor), are typically arranged in compact, highly dense arrays (e.g., those with the balls positioned apart on only 0.050 inch centers). The electrical circuitry for such packages is also highly dense, and may possess line widths as small as about 0.002 inch, with 0.002 spacings between lines. Even smaller elements are presently being contemplated for future products.

It is readily understood that testing of such structures is a critical and necessary step during the manufacture thereof, in order to prevent subsequent failure when the package is utilized in a larger (and very expensive) assembly such as a microprocessor or the like. It is also understood that such testing can be a difficult, complex and time-consuming operation.

Examples of various means for testing electronic structures are illustrated in the following U.S. Letters Patents. In U.S. Pat. No. 4,105,970 (Katz), a test pin with a jagged edge is utilized, while in U.S. Pat. No. 4,686,464 (Elsasser), buckling beam connectors are used. A printed circuit board tester using a plurality of apparently spring-loaded pin contacts is described in U.S. Pat. No. 4,851,765 (Driller et al) and an electrical circuit test probe, also spring-loaded, is described in U.S. Pat. No. 4,885,533 (Coe). U.S. Pat. No. 5,032,787 (Johnston) describes an elongated test probe with a spring-loaded plunger which is rotated during movement to make contact with the desired object being tested, while U.S. Pat. No. 5,204,615 (Richards et al) describes a module claimed to be able to test "linear high density" test site arrays. U.S. Pat. No. 5,391,995 (Johnston) describes a spring-biased test probe having an end configured to make frictional pressure contact with the test site (e.g., a board). In IBM Technical Disclosure Bulletin (TDB) vol. 25, no. 11B (April, 1983), there is defined a spring-loaded probe with a rotational wiping feature, the probe having ajagged tip portion. In IBM TDB vol. 37, no. 02B (February, 1994), another example of the aforementioned buckling beam connectors is defined.

When simultaneously testing pluralities of conductive members such as the above-described extremely small solder balls arranged in a highly dense array, it is quickly understood that precisioned alignment of each test probe member is critical. Clearly, these probes must maintain a spaced relationship from one another (or shorting can occur during test), and must also allow ease of movement of the individual probes toward and away from the object being tested. It is not believed that the test apparatus described in the above patents and published documents (TDBs) can provide such connection and movement in an effective and cost-efficient manner capable of meeting many of today's demanding production schedules.

It is believed, therefore, that a test apparatus capable of effectively testing highly dense arrays of conductive members such as small diameter solder balls in a precise yet expedient manner such as taught herein would constitute a significant advancement in the art.

OBJECTS AND SUMMARY OF THE INVENTION

It is, therefore, a primary object of the present invention to enhance the electrical test probe art and particularly that portion of the art dedicated to testing highly dense conductor arrays on such electronic components as electronic packages.

It is another object of the invention to provide such a test apparatus which maintains highly precise alignment between the apparatus' probe members and the conductors being contacted as part of such testing.

It is yet another object of the invention to provide such a test apparatus which can be operated in a facile manner and is relatively inexpensive to manufacture and operate.

In accordance with one embodiment of the invention, there is provided a test apparatus for making electrical contact with at least one (and preferably several) electrically conductive member of an electronic component (such as an electronic package having highly dense arrays of solder elements as part thereof), the test apparatus comprising a holder for holding the electronic component in a predetermined alignment relative to a first axis, a housing adapted for being positioned along the first axis for electrically engaging the conductive member when the conductive member and the probe member are brought together, the probe member moving in a rotational manner with respect to the first axis during at least part of the engagement with the conductive member, first and second spaced apart means for precisely orienting the probe member substantially within the housing substantially along the first axis relative to the conductive member during the engagement with the conductive member, and biasing means for biasing the probe member in a direction toward the conductive member and substantially along the first axis.

BEST MODE FOR CARRYING OUT THE INVENTION

For a better understanding of the present invention, together with other and further objects, advantages and capabilities thereof, reference is made to the following disclosure and appended claims in connection with the above-described drawings.

It is understood that like numerals will be used to indicate like elements from FIG. to FIG. The partial views provided herein, all on an enlarged scale, are shown herein in such a manner for ease of illustration purposes.

Figure 1:
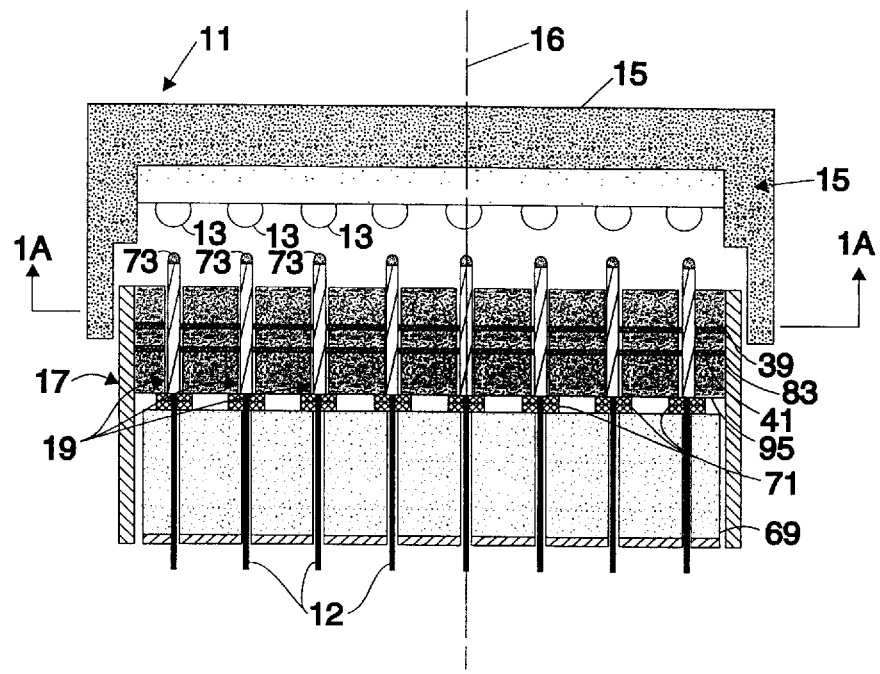
In FIG. 1, there is illustrated a test apparatus in accordance with one embodiment of the invention, this test apparatus capable of simultaneously testing several conductors of an electronic package shown nearby.
Figure 1A:
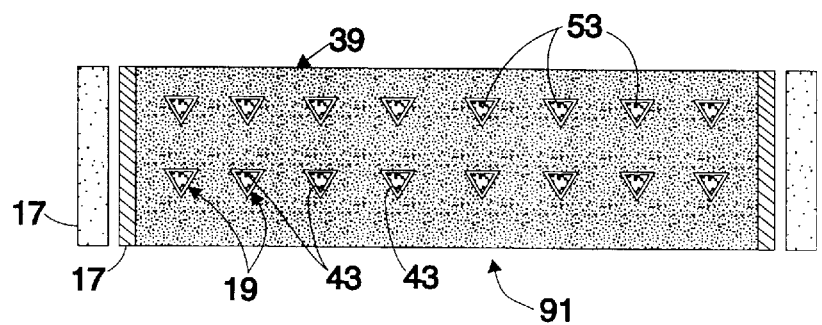
FIG. 1A is taken along the line 1A—1A in FIG. 1 to show an example of the cross-sectional configuration for some of the invention's elements.

FIG. 1 is a partial, side sectional view, in elevation and on a much enlarged scale, of a test apparatus 11 which enables electrical contact with electrically conductive members (e.g., solder balls 13) of an electronic package 14. FIG. 1A depicts a plan view of openings in one of the alignment layers 39 of the apparatus, through which probe members 19 (described below) may slide with rotational movement. Electrically conductive wires 12 are shown emanating from the probe members 19 and out of the test apparatus 11, and may be selectively connected to various electrical measurement equipment (not shown). It is understood that in the broader aspects of the invention that apparatus 11 may include only one probe member as part thereof. For testing conductive arrays such as solder balls on a component, however, several (e.g., from about 400 to as many as about 2000) probe members may be utilized in accordance with the teachings herein.

In FIG. 1, apparatus 11 includes a holder 15, a housing 17, numerous probe members 19, an elastomeric member 69, bearing members 71 (two per probe), first thin layer 39 and second thin layer 41 spaced apart by spacer member 83 and mechanically stiffened by stiffener 95. The test apparatus 11 is shown with an electronic component 14 placed in holder 15, located so that various electrically conductive members 13 (e.g., solder balls) face downward. As seen, each probe member 19 aligns with a respective conductive member 13 and is thus designed for electrically contacting each respective member 13 in accordance with the teachings herein.

It is understood that, although only sixteen probe members 19 are shown, several, including as many as 2,000, may be used, assuming 2,000 members 13 are utilized. The probe placement may be arranged in manners most suitable for electrical engagement with selected sites of such electrical components 14. In FIG. 1A, numerous triangular openings 43 are provided in thin layer 39 through which the first twist portion 53 of the probe members 19 are inserted. If electrically conductive members 13 of the electrical component 14 are arranged in a first pattern, the probe members 19 may be inserted through a corresponding second pattern of openings 91, or whatever pattern or arrangement is most convenient to enable electrical contact with selected electrically conductive members 13 upon actuation of the test apparatus 11. It may also be useful to include more or fewer probe members 19 than electrical conductive members 13 in this regard, for use of the test apparatus with a variety of designs of electrical components.

Figure 2:
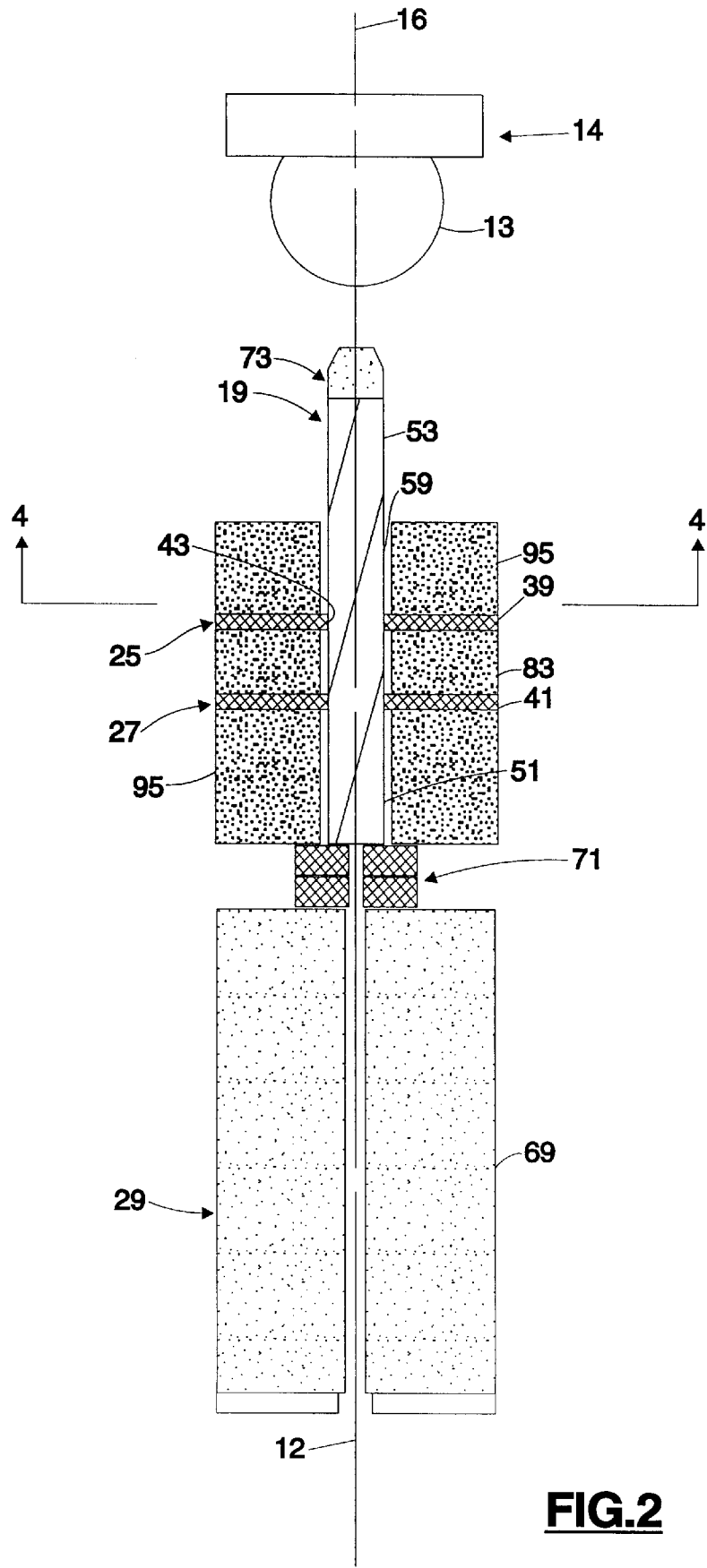
FIG. 2 is an enlarged (over FIG. 1) view of a single test apparatus in accordance with one embodiment of the invention, it being understood that the larger apparatus in FIG. 1 includes several of such apparatus. The apparatus in FIG. 2 is shown prior to conductor engagement.

FIG. 2 is an enlarged view of a portion of a test apparatus 11 in accordance with one embodiment of the invention, with a portion of a solder ball 13 of an electronic package 14 depicted. In this view, the probe 19 has not yet contacted the solder ball 13. A first axis 16 along the elongated body 51 of the probe member 19 is shown. Two thin alignment layers 39 and 41, used as first and second spaced apart means 25 and 27, are shown. Thin layers 39 and 41 are shown with openings 43 (see again FIG. 1A) for slidably engaging and orienting the first twist portions 53 of each probe member 19 along axis 16. Two low friction bearing members 71 (e.g., silicone washers) are also used, the upper slidably engaging the invention's stiffener 95 and the lower slidably engaging the invention's biasing means (e.g., elastomer 69).

Figure 3:
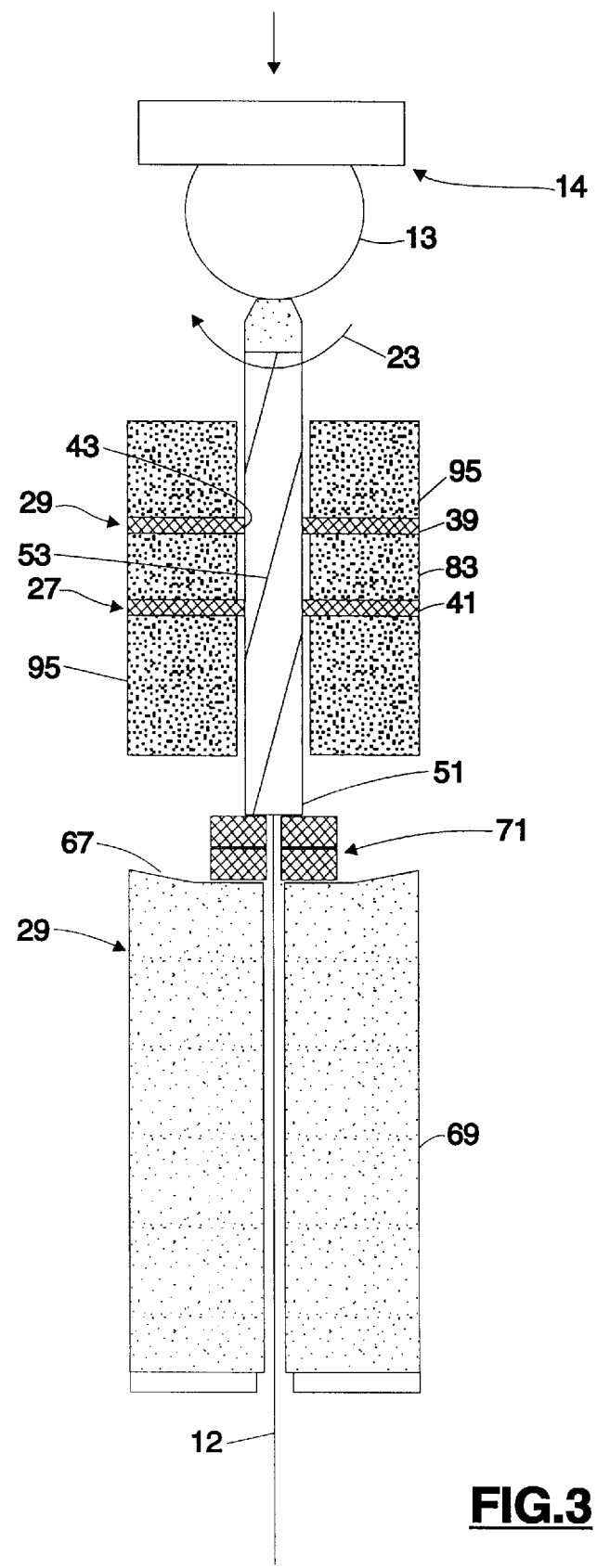
FIG. 3 is a view of the apparatus of FIG. 2 in a fully engaged position with a respective conductor.
Figure 4:
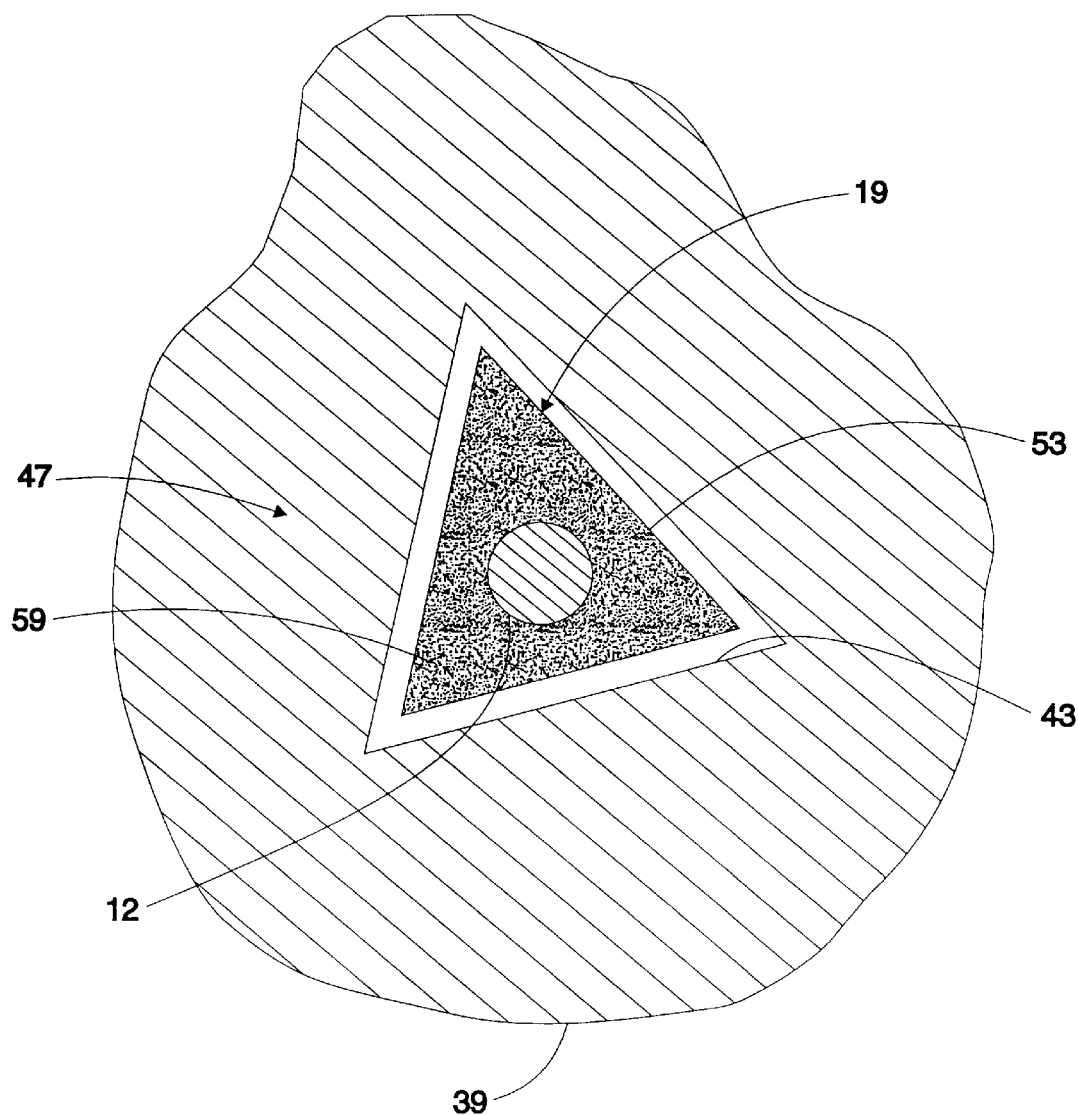
FIG. 4 is a cross-sectional view, muchly enlarged (over the FIG. 2 embodiment), of the apparatus of FIG. 2 as taken along the line 4—4 in FIG. 2.

The probe member 19 includes the described first twist portion 53 as part of an elongated body 51. Twist portion 53 is designed so that as it is pushed substantially along the first axis 16 through opening 43, the probe must rotate (rotational movement 23) as it slides through opening 43, as depicted in FIG. 3. The engagement of opening 43 with twist portion 53 is designed to be of low frictional resistance so that both slidable and rotational movement 23 are accomplished with minimum frictional resistance. There are numerous materials suitable for this purpose, depending on the dimensions of the probe member 19 and spacing of the pattern of openings 91. For a rectangular array of openings 91 spaced, e.g., 1.25 mm apart, and a probe nominal width of 0.5 mm, it may be most suitable to use copper for the electrically conductive wire 12, coated or overmolded with a Teflon or polyimide dielectric twist portion 53 of the body. (Teflon is a trademark of E. I. du Pont deNemours Company.) One external shape may be of a triangular polygon as seen in FIG. 4. Thin layers 39 and 41 may be of a copper alloy, with openings 43 photochemically etched, laser cut, or punched therein using processes known in today's flex circuitry manufacture. Each electrically conductive wire 12 is secured to the respective probe body and therefore rotates as the probe body rotates. Coiling, bending, and sufficient length of wire between the probe body to the nearest location where the wire is anchored must be accommodated to assure effective strain relief in the wire and to minimize resistance to probe rotation.

FIG. 3 is another partial side, sectional view of a portion of the test apparatus 11 of FIG. 1, with a portion of a solder ball 13 of an electronic component 14 (electronic package) depicted. In this view, the probe 19 has contacted the solder ball in accordance with the teachings herein. The relative movement along the first axis 16 direction has forced the probe member 19 to rotate as it moves, owing to the slidable engagement of the openings 43 in the first of the two alignment layers 39 and 41 and the twist portion 53 of the elongated body 51 of the probe. Thus, as the solder ball 13 is pushed onto the probe 19 along the first axis 16 direction, the probe rotates as contact takes place, with the amount of rotational movement 23 increasing as the solder ball is pushed farther along (downward in FIG. 3). This rotational movement of the probe promotes good electrical contact between the solder ball and the probe tip 73. Influencing the pushing force between the solder ball and the probe is the biasing means 29; here, depicted as an elastomeric layer 69 in a compressed state (including a compressed forward end portion 67). Also shown are the aforementioned low friction washers 71 acting as bearing members which allow biasing force on the probe 19 without substantial resistance to rotational movement 23 of the probe. The use of bearing members 71 allows the elongated body 51 of probe member 19 to turn easily while under resistive force provided by the biasing means 29. Suitable materials for such bearing members are well known in the art, one example being Teflon.

As the electrical component 14 is pushed onto the probes 19, biasing means 29 provides a resistive force on probe 19, so that pressure between projecting tip portion 73 and electrically conductive member 13 exists. Suitable biasing means include a layer of elastomeric material (such as silicone rubber), foamed material (perhaps in conjunction with a compressed trapped volume of gas), mechanical springs, or controlled buckling of a length of conductive wire 12. As clearly shown in FIG. 1 and further partially illustrated in enlarged FIGS. 2 and 3, the elastomeric layer 69 (biasing means 29) is positioned on a bottom wall of housing 17 to therefore understandably act against this wall when compressed such as seen in FIG. 3. Such compression understandably results in exertion of the defined biasing force. There are obviously many means of creating a resistive force on probe 19. It is useful to point out that the amount of resistive force required to be placed on probe 19 so that electrical engagement is achieved between tip portion 73 and electrically conductive member 13 is much less than what would be required by probes used in the art which do not employ rotational movement. (In part, this is important because the total loading between test apparatus 11 and electronic component 14 may become very large when the load between each probe (e.g., about 5 to 50 grams) is multiplied by the number (e.g., up to about 2000) of probes.) The reason for this is that debris, electrically insulative oxides, and the like typically exist on all electrically conductive members in practice. In order to make reliable electrical engagement (contact), the debris and/or oxides must be broken through, and it is known in the art that a wiping motion is effective for this. Combining contact pressure with rotational movement assures a wiping movement of the tip portion 73. This wiping movement does not exist for probes which do not employ rotational movement and just use high tip pressure to hopefully penetrate the oxide/debris layers.

There are numerous designs of openings 43 which will allow slidable engagement of twist portion 53 of probe member 19. These include substantially round (49, FIG. 8) square, rectangular, triangular (47, FIG. 4), polygonal, and combinations thereof. A key requirement is that the opening must allow the twist portion of the probe to slide through the opening, with sufficient engagement so that the probe rotates in a manner depicted in FIG. 3 about the first axis of the probe. Therefore, there is a substantial coupling of rotational and translational movement. The desired opening design would be one capable of engaging a twist portion having a cross-section of ovalized, triangular, and polygonal configuration. It is known that, for example, an eight-sided (hexagonal) opening can effectively engage a square cross section. However, for very small probe diameters, considering tolerances and material wear characteristics, the triangular twisted section shown in FIG. 4 is preferred.

FIG. 4 is a much enlarged partial plan view, in section, of a portion of the test apparatus 11 illustrated in FIG. 2, wherein a triangular polygonal shape 47 for the respective twist portion 53 of a probe member 19 can be seen. Alignment layer 39 is also shown. A circular electrically conductive portion of wire 12 inside the electrically insulative outer portion 59 of the probe member 19 is depicted.

Figure 8:
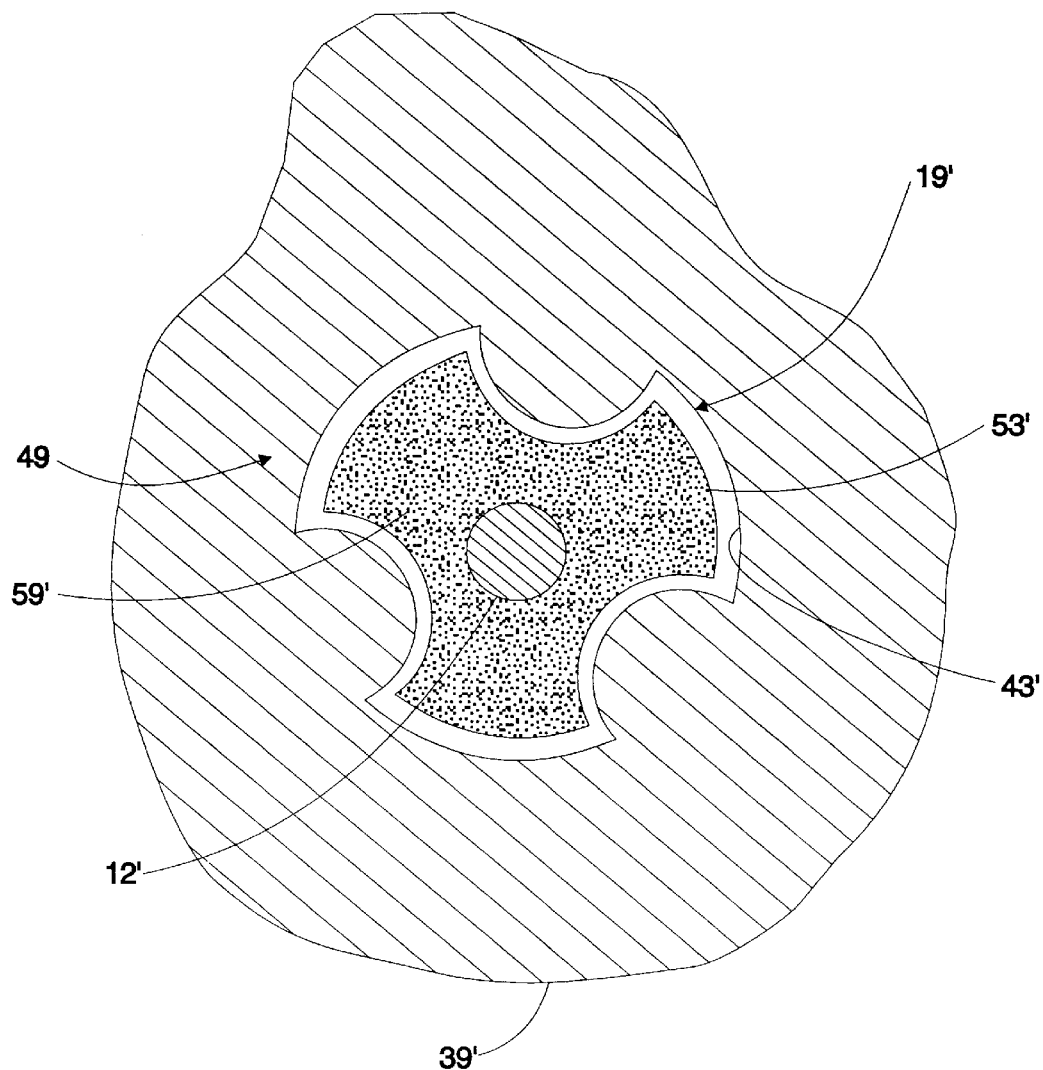
FIG. 8 is a cross-sectional view of an alternative shape for the probe member of the present invention which can also be successfully used in accordance with the teachings herein.

FIG. 8 is also a much enlarged partial plan view, in section, of a portion of a test apparatus similar to that indicated in FIG. 2, wherein a substantially round configuration (49) for the shape of the cross section of twist portion 53' is shown. A similarly rounded corresponding opening 43' is found in the adjacent alignment layer 39'. A round, electrically conductive portion for the wire 12' is also used, this being positioned inside the electrically insulative outer portion 59' of the probe member.

Figure 5:
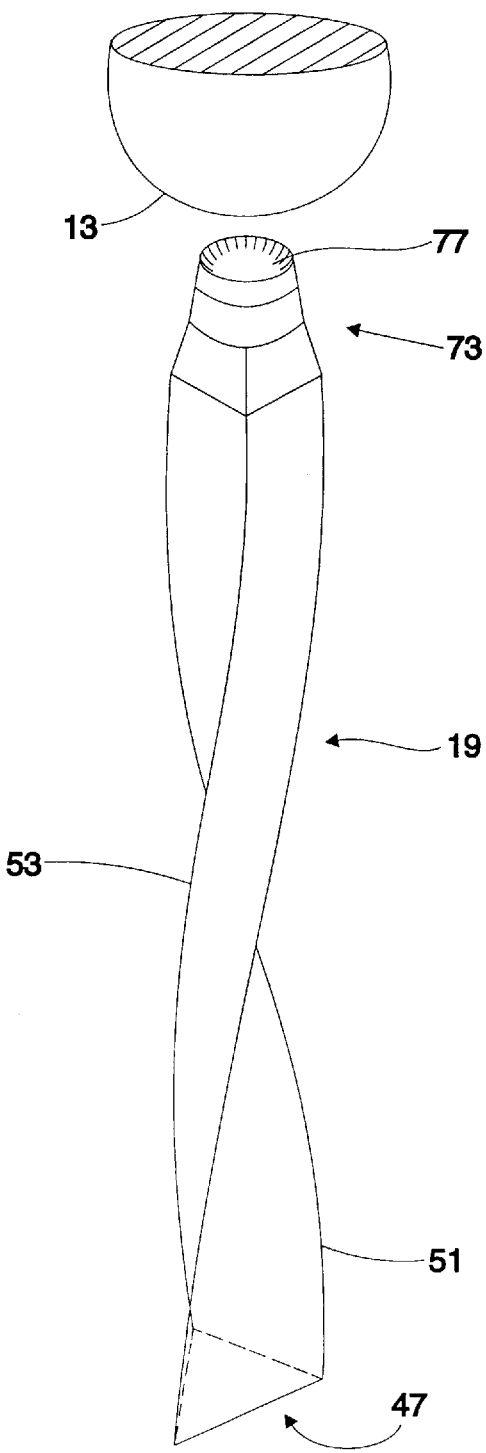
FIG. 5 is a partial perspective view of the end portion of a probe member in accordance with one embodiment of the invention.

FIG. 5 is a perspective sectional view of a portion of a probe member 19 in accordance with one embodiment of the invention, depicted with an electrically conductive solder ball member 13 aligned along the first axis of the probe. Only part of the spherical ball is shown for illustration purposes. A concave surface 77 for the projecting tip portion 73 is shown secured to the twist portion 53 of the probe member. There are various probe projecting tip portion 73 shapes which allow optimal electrical contact with various types and shapes of electrically conductive members 13, with the primary considerations being conductive member material, shape, and cleanliness (with regard to the state of debris and oxidation on the member), and temperature at which electrical contact is made to the probe. As shown in FIG. 5, a convex surface on tip portion 73 essentially conforms to the shape of a similarly rounded (spherical) solder ball element 13. This conforming configuration gives minimal localized pressure on the surface of the solder ball, which is important at high temperatures (where solder may become soft and creep) for minimal damage to the solder ball. Again, it is noted that the combination of rotational movement of the probe, in conjunction with contact pressure, enables electrical contact to be made with relatively low contact pressure. Similarly, a flat tip surface would conform to a flat metallic pad.

Figure 6:
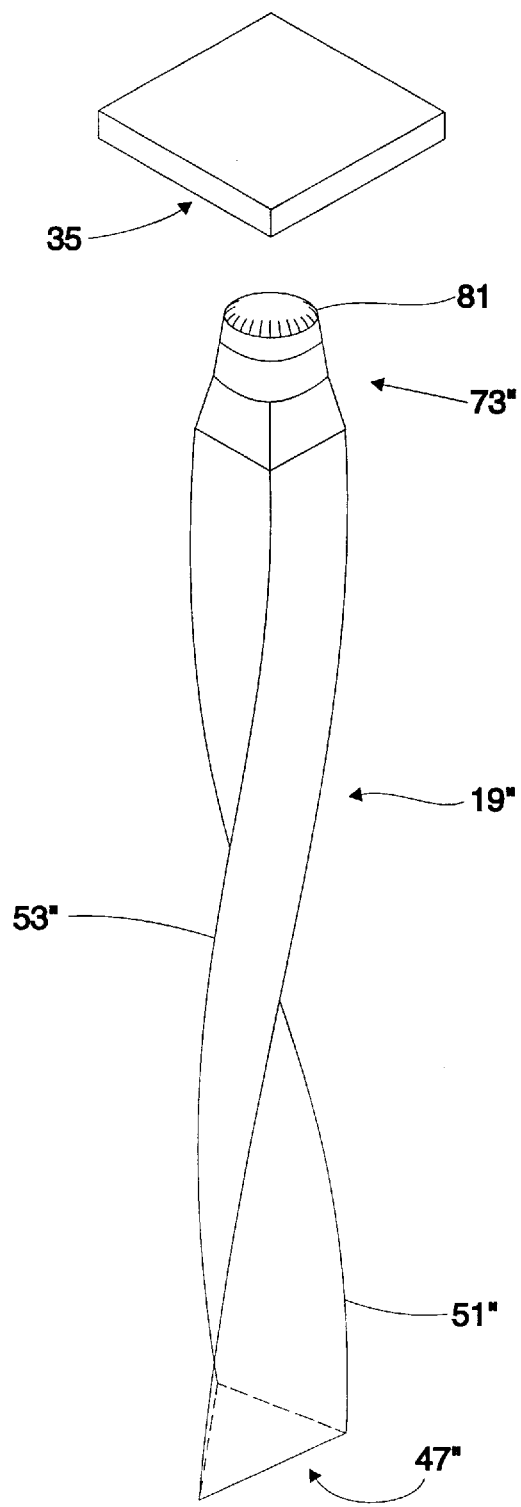
FIG. 6 is a partial perspective view of another embodiment of an end portion for the probe member of the invention.
Figure 7:
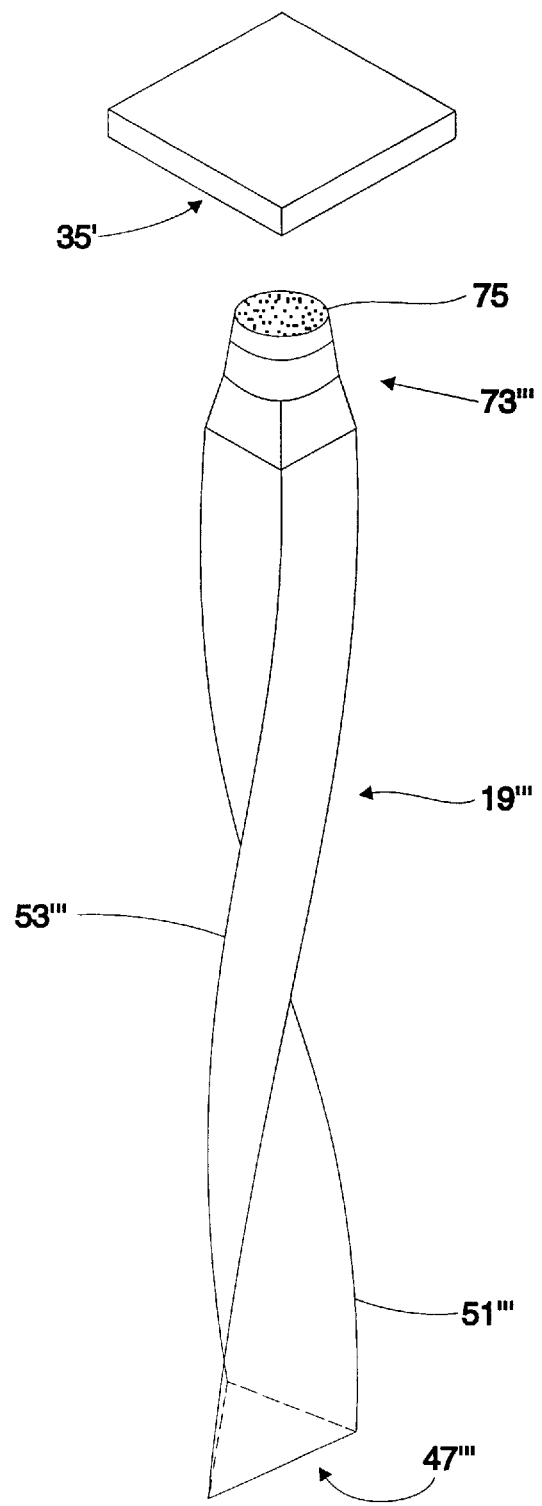
FIG. 7 is yet another perspective view of still another embodiment of a probe member's end portion for use in the present invention.

In FIG. 6, a convex surface 81 is depicted on tip portion 73", e.g., which would be suitable for contact with a planar metallic (e.g., copper) pad if higher localized pressure is desired. In FIG. 7, a convex tip portion 73'" is also shown, and includes several projections (e.g., several dendritic metallic elements). The combination of contact pressure with rotational movement of such a dendritic tip would be suitable for "scratching into" the metallic pad (35') if it includes a heavily oxidized, debris covered surface as is often encountered in practice. Such a tip portion, as shown, possesses a rough or dendritic surface. Dendritic elements capable of usage in the invention may be formed in accordance with the teachings in Canadian Patent 1,121,011 and U.S. Pat. No. 5,137,461.

Figure 9:
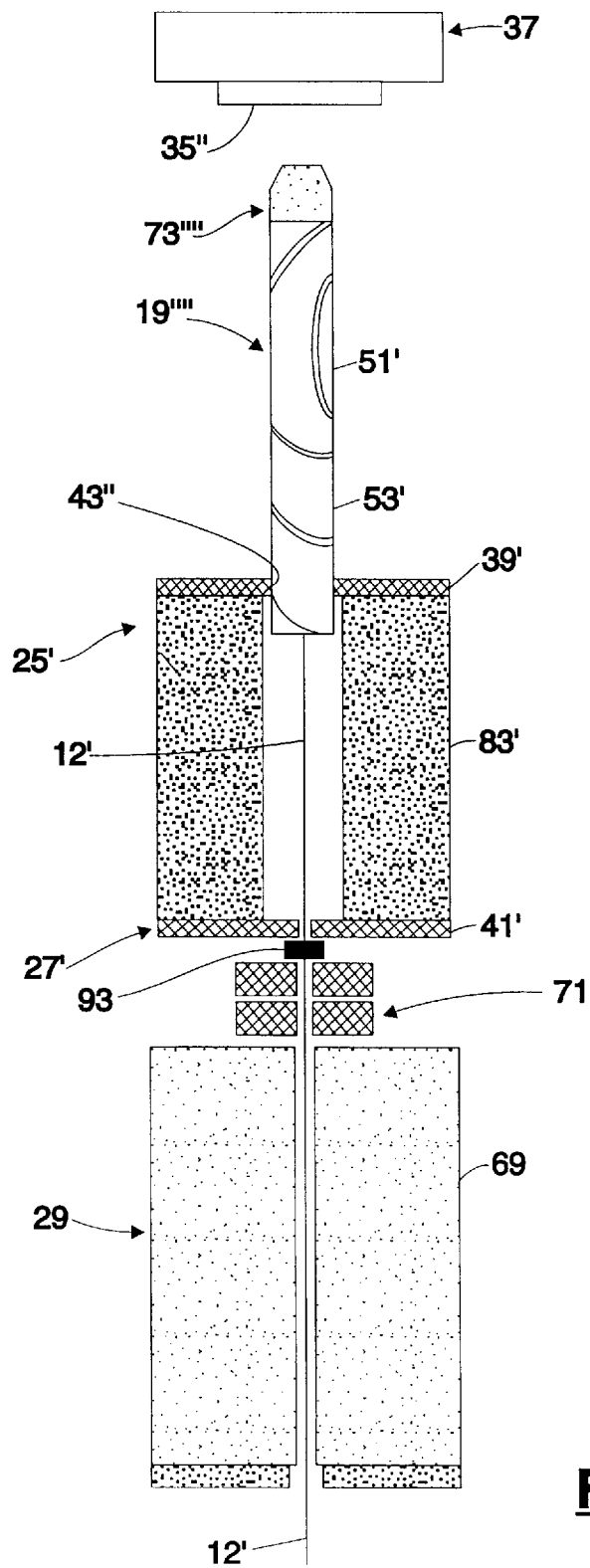
FIG. 9 is an enlarged side view of a test apparatus in accordance with another embodiment of the invention.

It is known in the art that in order to create reliable electrical contact between two extremely oxidized or debris covered surfaces, sometimes it is necessary to repeatedly wipe the contacts together under pressure, until electrical contact has been established. An embodiment of this invention which allows the test apparatus to take particular advantage of this is shown in FIG. 9, where a second twist portion 55 (in addition to the original, opposing twist portion 53') on probe member 19"" is shown. In FIG. 9, the probe has not yet contacted metallic pad member 35" (which maybe a contact site on a semiconductor device (chip) 37). Two spaced alignment layers 39' and 41' for slidably engaging and orienting the probe member 19"" are depicted. First layer 39' slidably engages the twist portion 53' of the probe member 19"" while second layer 41' slidably restrains the electrically conductive wire 12'. Understandably, a conductive wire 12' used in this embodiment should possess sufficient bending stiffness. First and second twist portions 53' and 55 are depicted on the elongated body 51' of probe member 19"", with the second twist portion 55 having substantially reversed pitch from the first. Two low friction bearing members 71 are also used and are shown in FIG. 9 between a retaining feature 93 (e.g., metal disk) secured to the electrically conductive wire 12' and the compressible elastomeric layer 69 used for biasing means 29. As this probe 19"" is actuated, the rotational movement will occur first in one rotational direction and then in another, opposite rotational direction as the probe slidably passes through opening 43". The rotary wiping action between the surface of the tip portion 73"" and the flat metallic pad 35" thereby repeatedly occurs during a single actuation which enhances the opportunity for the probe to rapidly and reliably make electrical contact with an oxidized, debris-covered metallic pad while using less force than would be needed by a similar probe capable of providing rotational movement in one direction only or no rotational movement at all. This feature of the invention is significant. When repeatedly actuating a test apparatus of the type herein in attempts to obtain electrical engagement with several highly dense arrays of multiple contact sites, there is generally some dimensional error in the alignment between the tips and corresponding sites. Each actuation therefore may place the probe in a slightly different spot on the respective component contact site. Also, after many attempts, the probe may land in the same spot more than once, so as to finally break through oxide/debris layer and make electrical engagement. If there are hundreds or thousands of probes in an apparatus, each required to make reliable electrical engagement, the probability of making reliable electrical engagement with all of them at once is greatly reduced in that situation. The present invention offers a practical solution to this problem by repeatedly wiping in the same spot during a single actuation. This feature, coupled with the aforedefined low-force contact and specifically designed tip surface shape, enables reliable electrical contact to be made to extremely delicate, highly dense and complex electrical components. One example of this is the unique ability of the invention to make electrical contact at several hundreds of contact sites across a thin, flexible printed circuit board without excessively bending the board. Another example is the ability of the invention to maintain effective electrical contact with numerous solder ball elements of an electronic component commonly known as a ball grid array package during long-term, relatively high temperature exposure (during "burn-in" of the component).

The preferred material for the probe's tip portion is selected from the group of metals consisting of nickel, tungsten, iron, aluminum, copper, noble metals, or alloys of one or more of these. Such material preferably possesses a melting point substantially above that of the conductive member being engaged by the probe.

The means 25 and 27 for orienting the probe member 19 optimally provide for minimal frictional resistance to probe movement as contact (translation coupled with rotational movement) with the electronic component 14 progresses. In FIGS. 1 and FIG. 2, use of two precisely spaced apart thin layers 39 and 41 are shown. The use of more than two layers may be advisable to provide additional support, e.g., to prevent unintentional elastic buckling of a very thin, elongated probe body 51. At least one of the thin layers will include openings 43 to slidably engage the twist portion 53 of the probe 19, with the other layer including openings to at least substantially maintain the probe along the first axis direction. However, both layers may include similar shaped openings 43, in which case the spacing and orientation of openings 43 of the layers must be designed to precisely correspond to the twist angle of the twist portion 53 so that movement of the probe member 19 is not frozen. For this purpose, spacer member 83 is designed with a precisely controlled thickness. The thickness of each thin layer is also carefully controlled to be small enough such that binding within the features of twist portion 53 does not occur. However, since relatively low angles of twist will most likely be used, this requirement is easily satisfied. Still further, the use of a softer metal (such as electroplated copper alloy) or a softer, more "slippery" plastic (such as Teflon) for these layers allows some localized yielding and stretching of the layers (at openings 43) so that binding of the probe movement is substantially eliminated with a few initial trial actuations of the test apparatus.

Figure 10:
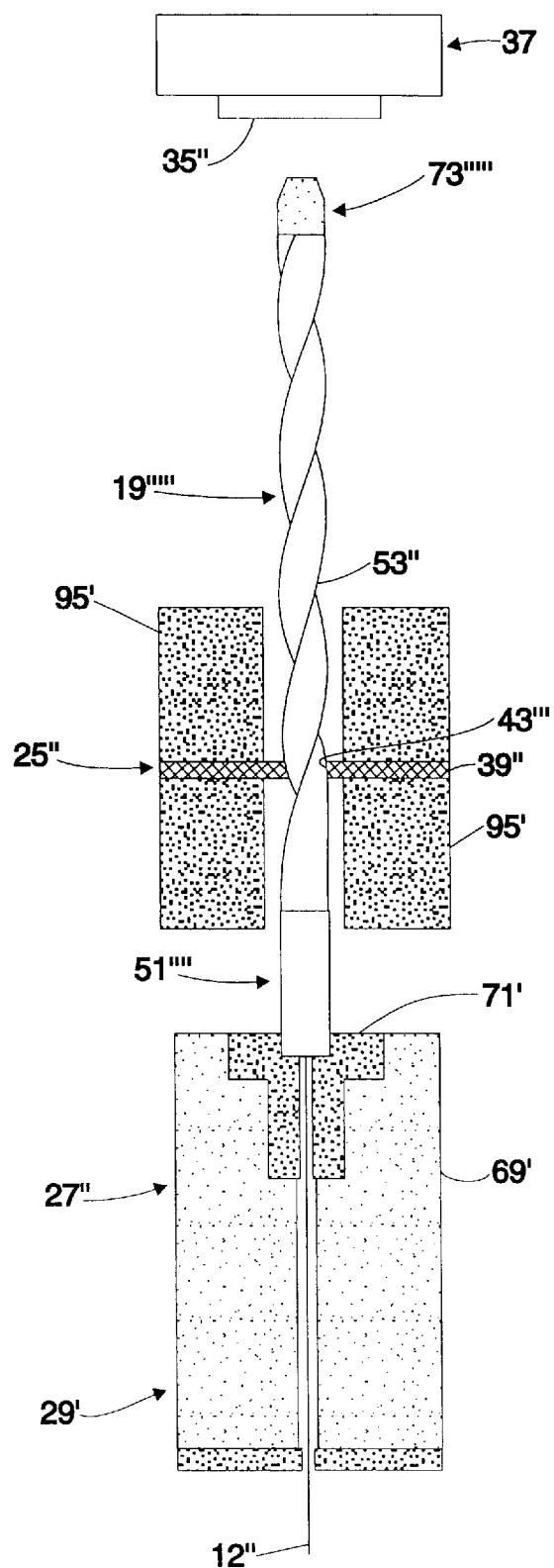
FIG. 10 is an enlarged side view of a test apparatus in accordance with still another embodiment of the invention.

The embodiment in FIG. 10 illustrates an alternative version of two, spaced-apart means 25" and 27" which function to align the probe. FIG. 10 is a partial side, sectional view of a portion of a test apparatus in accordance with this embodiment of the invention, with a portion of a metallic pad member 35" of a semiconductor device 37 depicted as the element being engaged. In this view, the probe 19'"" has not yet contacted the metallic pad member 35". Means 25" and 27" slidably engage and orient probe member 19'"", means 25" including a thin layer 39" with a corresponding opening 43'" through which the probe member 19'"" passes. In this embodiment, the first spaced apart means 25" is also located in a stiffener portion 95', which, like those in the foregoing FIGS., may be located in a suitable housing (e.g., 17). The second means 27" preferably comprises a low-friction bearing member 71' which comprises a flanged bushing securely positioned in a compressible elastomeric layer 69' used for the invention's biasing means. The bearing member 71' is inserted into elastomeric member 69' so that biasing means 29" and the second spaced apart means are physically combined. As the probe 19'"" is pressed by an electronic component (here, a semiconductor device 37), the opposite end of the probe is pressed into the elastomeric member, so that the bearing member 71' moves as the elastomeric member 69' compresses, while still maintaining probe orientation. Bearing member 71' also allows the probe to rotate with low frictional resistance. Because of the simplicity of design of the various elements of this embodiment, extremely close spacing of several probe members (0.1 mm or less) in an array pattern is possible, thus rendering the invention particularly adaptable to semiconductor chip testing.

In order to simplify manufacture, assembly of the probe members 19 into the test apparatus is best accomplished in stages so that the problem of aligning and placing hundreds (or thousands) of probes through means 25 is simplified. The various sections of means 25 can take the form of rectangular arrays or rows, as shown in FIG. 1A. The conductive wires are threaded through the bearing members 71 and elastomeric members 69. Subsequently, small groups of probes are pushed into place through sections of means 25 using stiffener members 95, all thus being positioned in housing 17. The housing may then be aligned within holder 15. In this manner, large arrays of probes may be assembled without having to simultaneously orient each probe.

In order to assure a test apparatus compatible with presently known semiconductor pad spacings (e.g., so that openings 91 are placed on 0.2–0.5 mm spacings), twist portion 53 of probe member 19 is preferably a drawn, twisted copper alloy wire of nominal triangular cross section. Also, the invention's first and second spaced apart means each preferably include a dielectric (e.g., Teflon) sheet with openings 43 (including copper plated) therein through which the probes 19 slidably engage. Such a dielectric sheet may also include a thin metallic (e.g., copper alloy) layer thereon with openings 43 photochemically etched therein (using known methods). Accordingly, slidable engagement takes place between the metallic copper layer and the metallic copper probe 19. In this embodiment, electrical contact may intermittently occur between the probe and conductive, thin layer. In order to prevent electrical shorting between probes (e.g., if a singular, common sheet is used for layer 39), the thin layer 39 may include numerous regions of copper, each of which are electrically isolated from one another, through each of which openings 43 are placed. Methods of constructing such a layer 39 are known in the art of flex circuitry and printed circuit board manufacture, and further description is not believed necessary.

While there have been shown and described what are at present the preferred embodiments of the invention, it will be obvious to those skilled in the art that various changes and modifications may be made therein without departing from the scope of the invention as defined by the appended claims.

What is claimed is:

1. A test apparatus for making electrical contact with at least one electrically conductive member of an electronic component, said test apparatus comprising:

a holder for holding said electronic component in a predetermined alignment relative to a first axis;

a housing adapted for being positioned relative to said holder;

at least one probe member positioned substantially within said housing and adapted for being positioned along said first axis for electrically engaging said conductive member when said conductive member and said at least one probe member are brought together, said at least one probe member moving in a rotational manner with respect to said first axis during said electrically engaging with said conductive member;

first and second spaced apart means for precisely orienting said at least one probe member substantially within said housing substantially along said first axis relative to said at least one conductive member during said engagement with said conductive member, said at least one probe member slidably engaging at least one of said first and second spaced apart means, said moving in a rotational manner of said at least one probe member caused by said slidably engaging by said probe member; and biasing means for biasing said at least one probe member in a direction toward said conductive member and substantially along said first axis.

2. The test apparatus of claim 1 wherein said conductive member is a solder element.

3. The test apparatus of claim 2 wherein said electronic component is a solder ball array module.

4. The test apparatus of claim 1 wherein said conductive member is a metallic pad.

5. The test apparatus of claim 4 wherein said electronic component is a semiconductor chip.

6. The test apparatus of claim 1 wherein said first and second spaced apart means for precisely maintaining said at least one probe member within said position during said electrically engaging with said conductive member are positioned within or form part of said housing.

7. The test apparatus of claim 6 wherein said first and second means for precisely maintaining said at least one probe member within said position comprise first and second thin layers spacedly positioned within said housing.

8. The test apparatus of claim 7 wherein said at least one probe member passes through said first and second spacedly positioned layers during said electrically engaging with said conductive member.

9. The test apparatus of claim 8 wherein said first and second spacedly positioned layers each include an opening therein, said at least one probe member passing through said openings during said electrically engaging with said conductive member.

10. The test apparatus of claim 9 wherein said openings are of a substantially polygonal configuration.

11. The test apparatus of claim 9 wherein each of said openings are of substantially triangular configuration.

12. The test apparatus of claim 9 wherein said openings are of substantially round configuration.

13. The test apparatus of claim 9 wherein said at least one probe member includes an elongated body having a first twist portion as part thereof.

14. The test apparatus of claim 13 wherein said at least one probe member further includes a second twist portion of substantially reverse pitch than said first portion.

15. The test apparatus of claim 13 wherein said elongated body is electrically insulative and includes an electrically conductive member as part thereof.

16. The test apparatus of claim 13 wherein said elongated body is electrically conductive.

17. The test apparatus of claim 1 wherein said at least one probe member slidably engages both said first and second spaced apart means for precisely orienting said at least one probe member.

18. The test apparatus of claim 1 wherein said holder for holding said electronic component is movably positioned substantially externally of said housing, said holder moving in a direction substantially parallel to said first axis during engagement between said at least one probe member and said electrically conductive member.

19. The test apparatus of claim 1 wherein said biasing means for biasing said at least one probe member in a direction toward said conductive member comprises a compressible member.

20. The test apparatus of claim 19 wherein said biasing means comprises an elastomeric member.

21. The test apparatus of claim 19 further including at least one bearing member adapted for slidably engaging said biasing means.

22. The test apparatus of claim 1 wherein said at least one probe member includes a projecting tip portion adapted for engaging said conductive member of said electronic component.

23. The test apparatus of claim 22 wherein the material for said projecting tip portion of said at least one probe member is selected from the group consisting essentially of nickel, tungsten, iron, aluminum, copper, noble metals, and alloys thereof.

24. The test apparatus of claim 22 wherein said tip portion is comprised of a metal with a melting point substantially above the melting point of the material comprising said electrically conductive member of said electronic component.

25. The test apparatus of claim 22 wherein said tip portion of said at least one probe member includes more than one projection, each of said projections adapted for engaging said electrically conductive member of said electronic component.

26. The test apparatus of claim 22 wherein said tip portion includes at least one concave surface.

27. The test apparatus of claim 22 wherein said tip portion includes at least one flat surface.

28. The test apparatus of claim 22 wherein said tip portion includes at least one convex surface.

29. The test apparatus of claim 1 wherein said housing includes a spacer member as part thereof, said means for precisely orienting said at least one probe member comprising first and second layers located on opposite surfaces of said spacer member.

30. The test apparatus of claim 1 wherein the number of said probe members is greater than one, said first and second spaced apart means for precisely orienting said at least one probe member further precisely orienting the others of said probe members.

31. The test apparatus of claim 30 wherein at least one of said spaced apart means occupies a plane substantially perpendicular to said first axis.

32. The test apparatus of claim 31 wherein said apparatus is adapted for making electrical contact with a plurality of electrically conductive members oriented in a first pattern, at least one of said spaced apart means including a plurality of openings therein, each of said probe members passing through a respective one of said openings, said openings occupying a second pattern substantially similar to said first pattern of said electrically conductive members.

* * * * *